United States Patent
Schimmel

(10) Patent No.: US 8,154,298 B2
(45) Date of Patent: Apr. 10, 2012

(54) APPARATUS FOR DETECTING AN ELECTRICAL VARIABLE OF A RECHARGEABLE BATTERY, AND METHOD FOR PRODUCING SAID APPARATUS

(75) Inventor: Ralf Schimmel, Weilmuenster (DE)

(73) Assignee: Continental Automotive GmbH, Hannover (DE)

(*) Notice: Subject to any disclaimer, the term of this patent is extended or adjusted under 35 U.S.C. 154(b) by 967 days.

(21) Appl. No.: 12/094,052

(22) PCT Filed: Oct. 27, 2006

(86) PCT No.: PCT/EP2006/067881
§ 371 (c)(1),
(2), (4) Date: May 16, 2008

(87) PCT Pub. No.: WO2007/062943
PCT Pub. Date: Jun. 7, 2007

(65) Prior Publication Data
US 2008/0238431 A1   Oct. 2, 2008

(30) Foreign Application Priority Data
Nov. 30, 2005  (DE) .......................... 10 2005 057 117

(51) Int. Cl.
*G01N 27/416* (2006.01)
*G08B 21/00* (2006.01)
*H01M 10/48* (2006.01)

(52) U.S. Cl. ................. 324/426; 324/76.11; 324/757.05; 324/763.01; 340/636.1; 340/636.21; 429/90

(58) Field of Classification Search .................... 324/426
See application file for complete search history.

(56) References Cited

U.S. PATENT DOCUMENTS

| 5,416,427 | A  | * | 5/1995  | Tracewell ................ 324/750.08 |
| 6,304,062 | B1 | * | 10/2001 | Batson ........................ 320/134 |
| 6,629,027 | B2 | * | 9/2003  | Yamaguchi et al. ............ 701/22 |
| 6,690,182 | B2 | * | 2/2004  | Kelly et al. ..................... 324/700 |
| 6,744,344 | B2 |   | 6/2004  | Geuder et al. ................. 337/140 |
| 2003/0076109 | A1 | * | 4/2003 | Verbrugge et al. ............ 324/427 |
| 2005/0031945 | A1 | * | 2/2005 | Morita et al. .................. 429/158 |
| 2007/0200720 | A1 |   | 8/2007 | Dreiskemper et al. ..... 340/636.1 |

FOREIGN PATENT DOCUMENTS

| DE | 100 00 500 A1 | 7/2001 |
| DE | 100 27 519 A1 | 1/2002 |
| DE | 203 18 266 U1 | 3/2004 |
| DE | 10 2004 007 851 A1 | 9/2005 |
| DE | 10 2004 033 127 | 4/2006 |
| DE | 102004033127 | 4/2006 |
| WO | WO 2006/048232 A1 | 5/2006 |

OTHER PUBLICATIONS

International Search Report PCT/EP2006/067881, 4 pages, Mar. 2, 2007.

* cited by examiner

*Primary Examiner* — Yalkew Fantu
(74) *Attorney, Agent, or Firm* — King & Spalding L.L.P.

(57) ABSTRACT

An apparatus for detecting an electrical variable of a rechargeable battery and a method for producing said apparatus, has: a measuring element (1), a printed circuit board (4) and a contact element (5) having a first end (6) and a second end (7), wherein the first end (6) of the contact element (5) is electrically connected to the printed circuit board (4), and the second end (7) of the contact element (5) is electrically connected to the measuring element (1) by a welded joint.

17 Claims, 2 Drawing Sheets

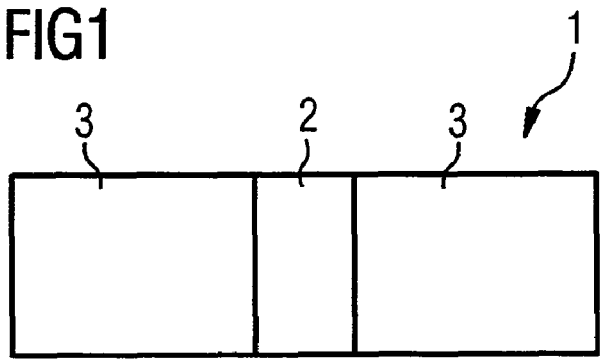
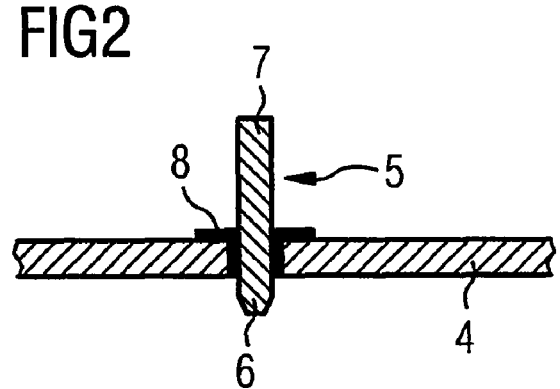
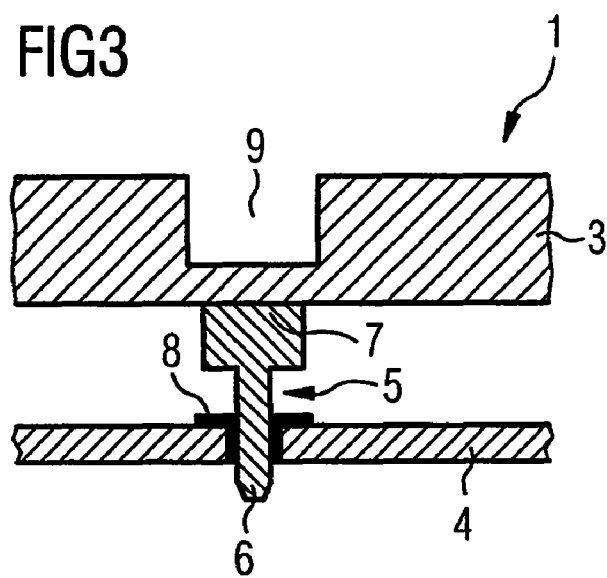

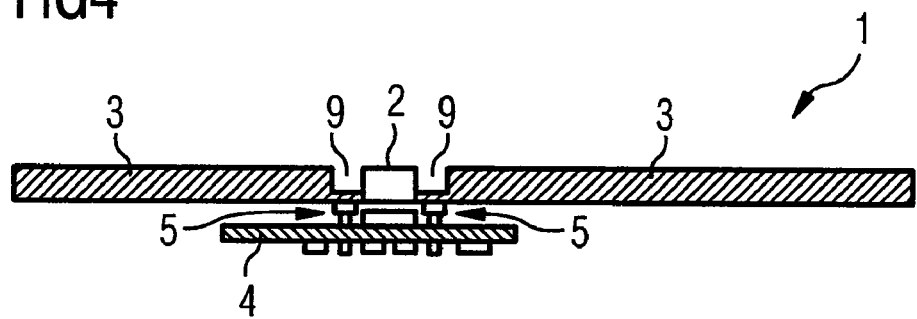
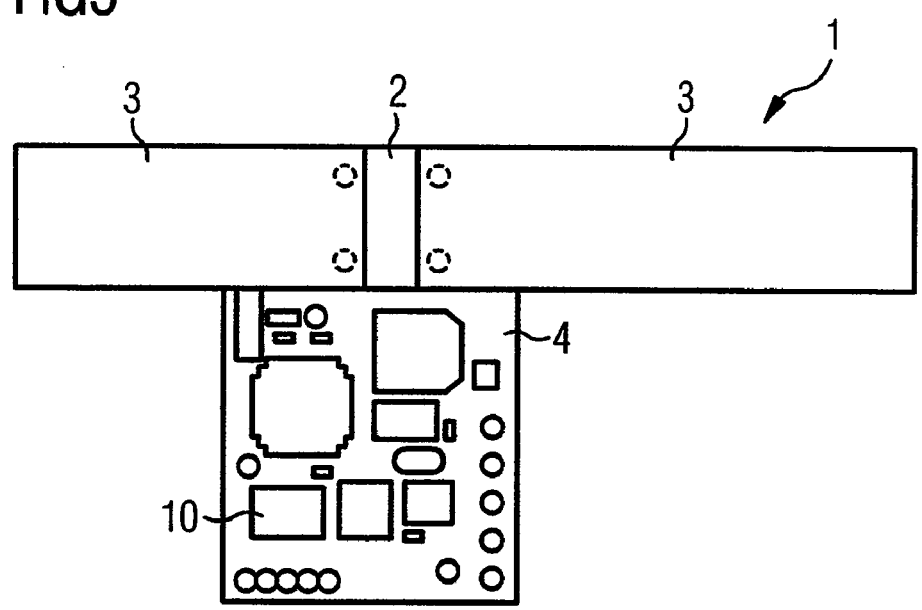

APPARATUS FOR DETECTING AN ELECTRICAL VARIABLE OF A RECHARGEABLE BATTERY, AND METHOD FOR PRODUCING SAID APPARATUS

CROSS-REFERENCE TO RELATED APPLICATIONS

This application is a U.S. national stage application of International Application No. PCT/EP2006/067881 filed Oct. 27, 2006, which designates the United States of America, and claims priority to German application number 10 2005 057 117.4 filed Nov. 30, 2005, the contents of which are hereby incorporated by reference in their entirety.

TECHNICAL FIELD

The present invention relates to an apparatus for recording an electrical variable of a rechargeable battery, which in particular can be used in motor vehicles. The invention also relates to a method for producing an apparatus such as this.

BACKGROUND

Monitoring devices are frequently used, in particular in motor vehicles, in order to record the state of charge and the state of a rechargeable battery itself, and allow conclusions to be drawn about these states on the basis of the voltage which is dropped across the rechargeable battery and/or the charging current and discharge current of the rechargeable battery.

The monitoring devices, which are also referred to as intelligent battery sensors, normally comprise a measurement element and evaluation electronics. The measurement element is provided, for example, by a measurement resistor (shunt) and connecting zones, by means of which electrical contact can be made with the measurement resistor. The electrical connection between the connecting zone of the measurement element and the evaluation electronics, which are located on a printed circuit board, is normally made by means of a contact element, which is soldered to the connecting zone.

Since the charging current and discharge current of the rechargeable battery flow through the measurement element, it is heated. Particularly high currents occur, for example, during the process of starting the motor vehicle, or in commercial vehicles. The current-dependent heating of the measurement element can lead to destruction of the soldered joint between a connecting zone of the measurement element and the contact element.

One possible way to avoid the disadvantages of a soldered joint between the measurement element and the contact element is disclosed in the subsequently published document DE 10 2004 033 127. This document discloses an apparatus for recording an electrical variable of a rechargeable battery, which has a measurement element connected in series with the rechargeable battery. The connection between the measurement element and evaluation electronics which are arranged at the printed circuit board is made by connecting a connecting element to the measurement element, with a friction fit and/or an interlock.

SUMMARY

A simple reliable and low-cost electrical connection between a measurement element and the evaluation electronics can be provided according to an embodiment, by a measurement element, a printed circuit board and a contact element which has a first and a second end with the contact element being electrically connected at the first end to the printed circuit board, wherein the second end of the contact element is electrically connected to the measurement element via a welded joint.

According to a further embodiment, the material thickness of the measurement element may be reduced at least in one area. According to a further embodiment, the material thickness of the measurement element may be matched in at least one area to a cross section of the contact element parallel to the welded joint. According to a further embodiment, the material thickness of the measurement element may be reduced in the area of the welded joint. According to a further embodiment, the material thickness of the measurement element may correspond to the cross section of the contact element parallel to the welded joint. According to a further embodiment, the material thickness of the measurement element may be reduced by means of at least one recess which is provided in the measurement element. According to a further embodiment, connections of the measurement element and the contact element can be composed of copper. According to a further embodiment, the measurement element may be electrically connected to the printed circuit board via four contact elements.

According to another embodiment, a method for producing an apparatus for recording an electrical variable of a rechargeable battery having a measurement element, a printed circuit board and a contact element which has a first and a second end with the contact element being electrically connected at the first end to the printed circuit board, may comprise the step of making an electrical contact between the second end of the contact element and the measurement element by means of a welding process.

According to a further embodiment, the welding process can be carried out in two steps, with the second end of the contact element being formed into a collar by means of pressure and a welding current in a first step, and with the collar being welded to the measurement element in a second step. According to a further embodiment, both steps of the welding process can be carried out on the same equipment. According to a further embodiment, a defined distance can be set between the measurement element and the temperature sensor which is located on the printed circuit board. According to a further embodiment, the measurement element can be provided with at least one recess, before the welding process.

BRIEF DESCRIPTION OF THE DRAWINGS

Exemplary embodiments of the invention will be explained in the following text with reference to the schematic drawings, in which:

FIG. 1 shows a plan view of a measurement element,

FIG. 2 shows a section through a contact element which is electrically connected to a printed circuit board, FIG. 3 shows a section through a contact element which is electrically connected to a printed circuit board and to a measurement element, FIG. 4 shows a section through an apparatus according to an embodiment for recording an electrical variable of a rechargeable battery, and FIG. 5 shows a plan view of an apparatus according to an embodiment for recording an electrical variable of a rechargeable battery.

DETAILED DESCRIPTION

According to various embodiments, an apparatus for recording an electrical variable of a rechargeable battery, may have: a measurement element, a printed circuit board and a contact element, which has a first and a second end, with the contact element being electrically connected at the first end to the printed circuit board, and with the second end of the contact element being electrically connected to the measurement element via a welded joint.

The electrical connection between the evaluation electronics, which are connected to the printed circuit board, and the measurement element is therefore made by welding the second end of the contact element to the measurement element. This welding process results in a permanent electrical connection between the contact element and the measurement element. Heating of the measurement element cannot lead to destruction of this connection. A further advantage of the apparatus according to various embodiments is that welded joints can be produced easily and at low cost. Furthermore, the welded joint provides the capability to vary the distance between the measurement element and the printed circuit board, and therefore between the measurement element and the evaluation electronics. Since the evaluation electronics frequently also have a temperature sensor for evaluation of the rechargeable battery temperature, the measurement result of the temperature sensor can be influenced by the measurement element, if the temperature of the measurement element is not the same as the rechargeable battery temperature. The measurement element must therefore be at a specific minimum distance from the temperature sensor.

According to an embodiment, the material thickness of the measurement element is reduced in at least one area. The material thickness of the measurement element is accordingly not homogeneous, but is reduced in one or more specific areas. This deliberate reduction in the material thickness reduces the heat dissipation from the measurement element and therefore makes welding easier, and in certain cases makes it possible for the first time.

According to another embodiment, the material thickness of the measurement element is matched in at least one area to a cross section of the contact element parallel to the welded joint. This matching to a cross section of the contact element parallel to the welded joint, for example to a diameter in the case of cylindrical contact elements, allows the welding process to be carried out for different cross sections (diameters in the case of cylindrical contact elements) of the contact elements.

According to yet another embodiment, the material thickness of the measurement element is reduced in the area of the welded joint. Deliberately reducing the material thickness of the measurement element in the area of the welded joint particularly effectively reduces the heat dissipation from the measurement element, which is the critical factor for production of the welded joint.

According to another embodiment, the material thickness of the measurement element corresponds to the cross section of the contact element parallel to the welded joint. Experiments have shown that this design results in the heat dissipation from the measurement element being optimally reduced.

According to another embodiment, the material thickness of the measurement element is reduced by means of at least one recess, which is provided in the measurement element. Recesses can be produced easily and at low cost, for example by a stamping process.

According to yet another embodiment, connections of the measurement element and the contact element are composed of copper. This avoids the creation of thermal stresses, which corrupt voltage or current measurements.

According to yet another embodiment, the measurement element is electrically connected to the printed circuit board via four contact elements. This allows the voltage and current to be measured particularly accurately.

Furthermore, according to another embodiment, a method for producing an apparatus for recording an electrical variable of a rechargeable battery, may have: a measurement element, a printed circuit board and a contact element, which has a first and a second end, with the contact element being electrically connected at the first end to the printed circuit board, and with an electrical contact being made between the second end of the contact element and the measurement element by means of a welding process. This method allows the apparatus to be produced in a simple manner, and at low cost.

According to an embodiment, the welding process is carried out in two steps, with the second end of the contact element being formed into a collar by means of pressure and a welding current in a first step, and with the collar being welded to the measurement element in a second step. This refinement allows the apparatus to be produced particularly easily.

According to another embodiment, both steps of the welding process are carried out on the same equipment. The apparatus can be produced at particularly low cost if the welding process is carried out on the same equipment (welding machine).

According to yet another embodiment, a defined distance is set between the measurement element and the temperature sensor which is located on the printed circuit board. This avoids the measurement result from the temperature sensor being influenced by the measurement element.

According to yet another embodiment, the measurement element is provided with at least one recess before the welding process. This allows the apparatus to be produced at low cost.

FIG. 1 shows a plan view of a measurement element 1. The measurement element 1 has a measurement resistor 2 and connections 3. The connections 3 are used to make electrical contact with the measurement resistor 2. The measurement resistor 2 may, for example, be composed of Manganin®, and the connections 3 may be composed of copper.

FIG. 2 shows a section through a contact element 5 which is electrically connected to a printed circuit board 4. The contact element 5 has a first end 6 which is electrically connected to a connecting zone 8 of the printed circuit board 4. The connecting zone 8 is a component of the printed circuit board 4. The electrical connection may be made, for example, by pushing the contact element 5 in or by soldering the contact element 5 to the connecting zone 8. The connecting zone 8 may, for example, be in the form of a conductor track, printed on the printed circuit board 4, and/or a via. A second end 7 of the contact element 5 can also be seen.

FIG. 3 shows a section through the contact element 5 which is connected to the printed circuit board 4, with the second end 7 of the contact element 5 being electrically connected to the measurement element 1. The electrical connection is made by welding the second end 7 of the contact element 5 onto the measurement element 1. Because of the pressure and the welding current, a first step of the welding process results in the second end 7 of the contact element 5 being thickened. A so-called collar is formed. In a second step of the welding process, this collar is welded to the measurement element 1, resulting in a welded joint between the measurement element 1 and the second end 7 of the contact element 5.

As can also be seen from FIG. 3, the material thickness of the measurement element 1 is reduced in the area of the welded joint. This deliberate reduction in the material thickness decreases the heat dissipation from the measurement element 1, and therefore makes welding easier, or in certain cases makes it possible for the first time. In this example, the material thickness is reduced by means of a rectangular recess 9 which is provided in the measurement element 1 and is located directly above the welded joint. By way of example, the recess 9 can be produced by a machining process or by a stamping process. The recess 9 need not necessarily be provided directly opposite the welded joint, on the side of the measurement element 1 opposite the welded joint, but may also be provided at different points on the measurement element 1. Furthermore, there is no need for the recess 9 to be rectangular; other geometric shapes, for example circles, are also possible.

FIG. 4 shows a section through an apparatus according to an embodiment for recording an electrical variable of a rechargeable battery. The measurement element 1 is electrically connected via contact elements 5 to components of evaluation electronics, which are located on the printed circuit board 4.

FIG. 5 shows a plan view of the apparatus according to an embodiment. The four circles which are indicated by dashed lines in the measurement element 1 in this case illustrate that the measurement element 1 is electrically connected to the evaluation electronics via four contact elements 5. These circles do not represent holes. The electrical connection by means of four contact elements 5 allows precise measurements of currents and voltages. As can also be seen from FIG. 5, the evaluation electronics have, inter alia, a temperature sensor 10 for recording the rechargeable battery temperature. The temperature sensor 10 may, for example, be integrated in an ASIC.

What is claimed is:

1. An apparatus for recording an electrical variable of a rechargeable battery, comprising:
   a printed circuit board,
   a measurement element that extends generally parallel to a plane of the printed circuit board, and
   a contact element which has a first and a second end with the contact element being electrically connected at the first end to the printed circuit board,
   wherein the second end of the contact element is electrically connected to the measurement element via a welded joint, and
   wherein an area of the measurement element proximate the welded joint has a reduced material thickness in a direction perpendicular to the plane of the printed circuit board as compared to areas of the measurement element away from the welded joint.

2. The apparatus according to claim 1, wherein the material thickness of the measurement element is reduced at least in one area.

3. The apparatus according to claim 2, wherein the material thickness of the measurement element is matched in at least one area to a cross section of the contact element parallel to the welded joint.

4. The apparatus according to claim 1, wherein the material thickness of the measurement element corresponds to the cross section of the contact element parallel to the welded joint.

5. The apparatus according to claim 2, wherein the material thickness of the measurement element is reduced by means of at least one recess which is provided in the measurement element.

6. The apparatus according to claim 1, wherein connections of the measurement element and the contact element are composed of copper.

7. The apparatus according to claim 1, wherein the measurement element is electrically connected to the printed circuit board via four contact elements.

8. A method for producing an apparatus for recording an electrical variable of a rechargeable battery having a printed circuit board, a measurement element that extends generally parallel to a plane of the printed circuit board, and a contact element which has a first and a second end with the contact element being electrically connected at the first end to the printed circuit board, the method comprising the step of:
   making an electrical contact between the second end of the contact element and the measurement element by means of a welding process;
   wherein the welded electrical contact is formed at an area of the measurement element having a reduced material thickness in a direction perpendicular to the plane of the printed circuit board as compared to areas of the measurement element away from the welded joint.

9. The method according to claim 8, wherein the welding process is carried out in two steps, with the second end of the contact element being formed into a collar by means of pressure and a welding current in a first step, and with the collar being welded to the measurement element in a second step.

10. The method according to claim 9, wherein both steps of the welding process are carried out on the same equipment.

11. The method according to claim 8, wherein a defined distance is set between the measurement element and the temperature sensor which is located on the printed circuit board.

12. The method according to claim 8, wherein the measurement element is provided with at least one recess, before the welding process.

13. An apparatus for recording an electrical variable of a rechargeable battery, comprising:
   a measuring device comprising a resistor and terminals,
   a printed circuit board and a contact element which has a first and a second end with the contact element being electrically connected at the first end to the printed circuit board, wherein the second end of the contact element is electrically connected to a terminal of the measuring device via a welded joint; and
   wherein a material thickness of the terminal in a direction perpendicular to a plane of the printed circuit board is reduced compared to a material thickness of the resistor in the direction perpendicular to the plane of the printed circuit board.

14. The apparatus according to claim 13, wherein the material thickness of the measuring device is matched in at least one area to a cross section of the contact element parallel to the welded joint.

15. The apparatus according to claim 13, wherein the material thickness of the measuring device corresponds to the cross section of the contact element parallel to the welded joint.

16. The apparatus according to claim 13, wherein the material thickness of the measuring device is reduced by means of at least one recess which is provided in the measuring device.

17. The apparatus according to claim 13, wherein the terminals of the measurement element and the contact element are composed of copper.

\* \* \* \* \*